(12) United States Patent
Burie et al.

(10) Patent No.: US 7,254,306 B2
(45) Date of Patent: Aug. 7, 2007

(54) OPTOELECTRONIC COMPONENT WITH CURVED WAVEGUIDE WITH INWARDLY SLOPED SIDES

(75) Inventors: Jean-René Burie, Bruyères-le-Châtel (FR); Geneviève Glastre, Linas (FR)

(73) Assignee: Avanex Corporation, Fremont, CA (US)

( * ) Notice: Subject to any disclaimer, the term of this patent is extended or adjusted under 35 U.S.C. 154(b) by 0 days.

(21) Appl. No.: 11/130,753

(22) Filed: May 17, 2005

(65) Prior Publication Data

US 2005/0271327 A1 Dec. 8, 2005

(30) Foreign Application Priority Data

May 17, 2004 (FR) .................................. 04 50972

(51) Int. Cl.
*G02B 6/122* (2006.01)
(52) U.S. Cl. ...................................................... 385/131
(58) Field of Classification Search ..................... None
See application file for complete search history.

(56) References Cited

U.S. PATENT DOCUMENTS

| 5,274,720 A | 12/1993 | Yamamoto |
| 5,737,474 A | 4/1998 | Aoki et al. |
| 6,374,028 B2 * | 4/2002 | Yamada et al. ............. 385/131 |
| 6,934,447 B2 * | 8/2005 | Kim ............................ 385/45 |
| 6,950,588 B2 * | 9/2005 | Terakawa et al. ........... 385/129 |
| 2001/0036679 A1 | 11/2001 | Bouche et al. |
| 2002/0014836 A1 * | 2/2002 | Codama et al. ............. 313/504 |
| 2002/0187579 A1 | 12/2002 | Kubota |

FOREIGN PATENT DOCUMENTS

| EP | 0651268 | 5/1995 |
| EP | 1 130 425 | 9/2001 |
| WO | WO 01/17076 | 3/2001 |

OTHER PUBLICATIONS

S. J. Pearton, F. Ren, W. S. Hobson, C. A. Green, and U. K. Chakrabarti, Dry Etching Of Submicron Gratings For InP Laser Structures—Comparison Of HI/H$_2$, CH$_4$/H$_2$ and C$_2$H$_6$/H$_2$ Plasma Chemistries, 8303 Semiconductor Science and Technology, Sep. 7, 1991, No. 9, Bristol, Great Britain.
French Search Report, Application No. 0450972, dated Dec. 22, 2004.
EP Search Report, Application No. 05 300 377.8, dated Jun. 16, 2005.

* cited by examiner

*Primary Examiner*—Sung Pak
*Assistant Examiner*—Jerry T. Rahll
(74) *Attorney, Agent, or Firm*—Patterson & Sheridan, LLP

(57) ABSTRACT

The invention concerns semiconductor optoelectronic components with ribbon-shaped waveguide supported by a substrate. According to the invention the ribbon includes lateral sides and a light output face, characterized by said ribbon including a portion curved by more than two degrees in relation to the normal to the light output face, and the lateral sides being inwardly sloped on the substrate. The optoelectronic component may be an electro-optical modulator, a semiconductor optical amplifier, a semiconductor laser or a Mach-Zehnder-type interferometer. The component may also be formed by joining two of these devices.

16 Claims, 2 Drawing Sheets

OPTOELECTRONIC COMPONENT WITH CURVED WAVEGUIDE WITH INWARDLY SLOPED SIDES

CROSS-REFERENCE TO RELATED APPLICATIONS

This application claims priority benefit under 35 U.S.C. § 119 of French Application Serial No. FR 0450972, filed May 17, 2004. The aforementioned related patent application is herein incorporate by reference.

BACKGROUND OF THE INVENTION

1. Field of the Invention

This invention concerns a semiconductor optoelectronic component consisting of a ribbon-shaped waveguide that is curved more than two degrees with inwardly sloping sides.

2. Description of the Related Art

The type of optoelectronic component in the present invention is illustrated in FIG. 1. In this figure, component 10 includes a substrate 12 and an approximately rectangular parallelpiped ribbon-shaped waveguide 14. When the component is formed by joining a laser and a modulator, the length of the ribbon waveguide is typically 600 microns and its width is 2.5 microns. The waveguide includes lateral sides 16 and 18. The substrate and the waveguide are formed by stacking layers of semiconductor material. The two ends of the stack are covered by a metallic layer that provides electric contact. Reduced to its simplest form, the stack is formed by a first layer (the substrate), by a vertical optical confinement layer (in direction Oyo) for waves propagating in the guide, by a lateral optical confinement layer (in direction Ox) and by a contact layer. This last layer is thin compared to the thickness of the lateral optical confinement layer, which constitutes in fact the semiconductor channel in which the waves are propagated. Classically, two improvements have been separately made to this component. On the one hand, the rectangular shape of the ribbon guide has been curved to prevent interference from waves reflecting on the output face of the component (and also possibly on the entry face). This curvature has been obtained by chemical etching with hydrochloric acid during manufacture of the component. On the other hand, the lateral sides of the ribbon guide have been sloped inward in relation to the vertical of the substrate in order to reduce the electrical resistance of the component. Moreover, for this same component a very slight curvature of the guide, at most of two degrees, has been created. The slope of the lateral sides and the very slight curvature were obtained by chemical attack with hydrobromic acid. These features will be developed later in the presentation of the invention.

However, using these techniques it is not possible to obtain a curvature of the guide ribbon greater than two degrees and a slope of the lateral sides for the same component. Chemical attack by hydrochloric acid allows obtaining the curvature of the guide, but not the slope of the sides and attack by bromohydric acid allows obtaining the slope of the sides, but not a curvature of the waveguide of greater than two degrees.

SUMMARY OF THE INVENTION

This invention provides a solution to this technical problem by allowing obtainment of a guide that is curved by more than two degrees and has inward sloped sides on the same optoelectronic component.

More precisely, the objective of the invention is a semiconductor optoelectronic component consisting of a ribbon-shaped waveguide supported by a substrate, the ribbon including lateral sides and a light output face, such that said ribbon includes at least one portion curved by more than two degrees in relation to the perpendicular to the light output face, and the lateral sides are sloped inwardly on the substrate.

According to one implementation, the width of said ribbon, for a same distance in relation to said substrate, is noticeably constant along the ribbon and may, but not necessarily, terminate at the output of the waveguide in a flared shape.

In another implementation, said curved portion has a flared shape at the output of the waveguide.

The optoelectronic component may be, for example, one or the other of the following devices: an electro-optical modulator, a semiconductor optical amplifier, a semiconductor laser and a Mach-Zehnder-type interferometer. The component may also be formed by joining two of these devices, for example, a laser followed by an electro-optical modulator.

The invention also concerns a procedure for creating said ribbon of the optoelectronic component, consisting in the use of hydriodic acid to produce the sloped lateral sides.

In one implementation of the procedure, said ribbon is supported by a substrate and is formed by a stack of layers comprising, from the substrate, at least one vertical optical confinement layer containing arsenic, one lateral optical confinement layer not containing arsenic and one contact layer containing arsenic, the procedure consisting in the following:

the deposit of a resin mask on said contact layer, covering the trace of said ribbon, using photolithography;
  the removal of the portion of said contact layer not located under said resin layer, using ionic cleaning;
  the chemical etching of said lateral optical confinement layer, using hydriodic acid; and,
  the removal of said resin mask.

The hydriodic acid solution is preferably pure hydriodic acid.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 2:
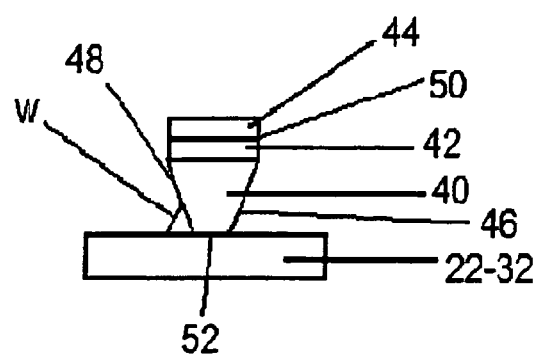
FIG. 2 is an above view of an example of implementation of the component.

FIG. 2 schematically represents an above view, according to the Oy axis, of a mode of implementation of the invention that concerns the first improvement mentioned above, the curvature of the waveguide. In this figure, the waveguide 20, supported by substrate 22, includes a straight portion 24 followed by a curved portion 26 directed toward output 28 of the guide, which constitutes the light output face. The sides of the guide ribbon 20 are sloped inward in relation to the vertical (the surface of the substrate is in the zOx plane and the vertical is thus according to the Oy axis). The width of said ribbon (20), for a same vertical distance (according to the Oy axis) in relation to said substrate (22), is approximately constant along said ribbon. In other terms, the two upper edges of the waveguide are approximately parallel as represented in FIG. 2.

The curved portion 26 makes it possible to reduce, or even delete, the waves reflected by the output face 28 and thus avoid perturbations caused by a coupling in the component of reflected waves with waves propagated toward the output (in the Oz direction). When the component is a semiconductor optical amplifier, it is useful to curve the guide at its two extremities in order to eliminate perturbations due to reflected waves at the two extremities.

Figure 1:
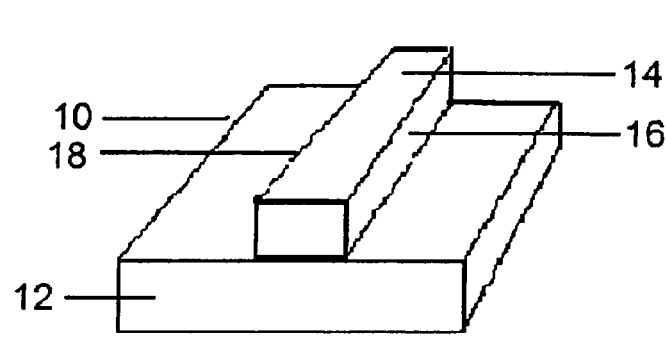
FIG. 1 schematically represents the general architecture of the components concerned by the invention.
Figure 3:
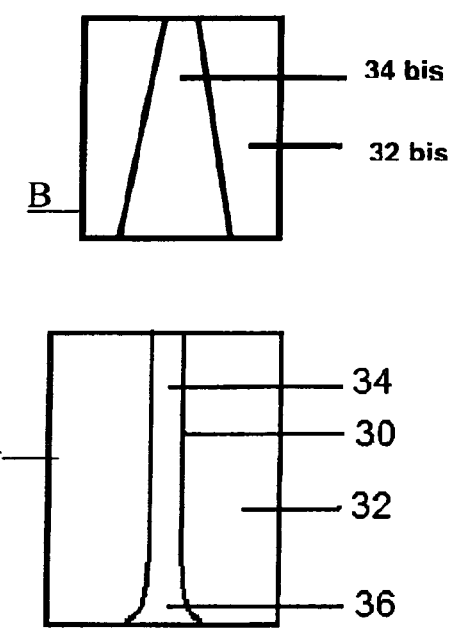
FIG. 3 is an above view of two other examples of implementation of the component.

FIG. 3A shows another form of implementation, in an above view, of a curved guide. The guide ribbon 30, supported by the substrate 32, includes a straight portion 34 followed by a curved portion 36 but here with a flared shape. In the second implementation shown from above in FIG. 3B there is no straight portion. The ribbon guide 34a, supported by substrate 32a, has only lateral sides that diverge in relation to each other (above view).

According to the prior art, the curvature of the waveguide is created primarily by chemical cleaning with hydrochloric acid. According to the invention, hydriodic acid is used.

Figure 4:
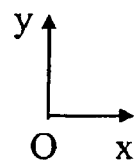
FIG. 4 is a cutaway view according to an xOy plane of the components of FIGS. 2 and 3, FIGS. 5 to 7 illustrate the procedure of implementation of the component.

The second improvement mentioned above, illustrated in FIG. 4, consists in giving an inward slope to the lateral sides of the guide. In FIG. 4, which is a cutaway view of the optoelectronic component in FIG. 2 or 3, according to an xOy plane, the guide ribbon, supported by the substrate 22 (FIG. 2) or 32 (FIG. 3), is formed by stacking a lateral optical confinement layer 40, a contact layer 42 and a metallic layer 44 for electrical contact. The diagram is not to scale, the whole of layers 42 and 44 is very thin (on the order of 0.3 µm) compared to the thickness of layer 40 (on the order of 3 µm). The lateral sides 46 and 48 form an inward angle w in the xOy plane. The purpose of this slope is to reduce the electrical resistance of the component, which is due to the electrical resistance of the interface 50 between the metallic layer 44 and the contact layer 42. This electrical resistance R is equal to $$R = \rho \, l/S$$

where $\rho$ is the resistivity, $l$ is the length and $S$ is the surface of the interface. By increasing surface S, electrical resistance R is thus reduced. The reduction of resistance R allows reduction of electrical consumption and heating of the component. It also allows increasing bandwidth. However, for the purposes of guiding optical waves, the width 52 at the base of the guide may not exceed a certain value. This width is on the order of several microns, for example, 2.5 microns. There are thus two opposing requirements: on the one hand, to obtain the weakest electrical resistance R by increasing the surface S and, on the other hand, not to exceed certain values for the width 52 at the base of the waveguide. The slope of the lateral sides 46 and 48 provides a good compromise to these conflicting requirements.

According to the prior art, the slope of the lateral sides is obtained by chemical attack, using hydrobromic acid. The attack by hydrobromic acid also makes it possible to obtain a very slight curvature of the guide ribbon that does not exceed two degrees. Beyond this value, a severe attack on the sides occurs that destroys the desired slope and makes the component unusable. According to the invention, the slope of the lateral sides is obtained by chemical attack using hydriodic acid. The use of this acid thus makes it possible to obtain both the curvature of the waveguide, with a curvature greater than two degrees, and the slope of the lateral sides, which the prior art does not allow.

Figure 5:
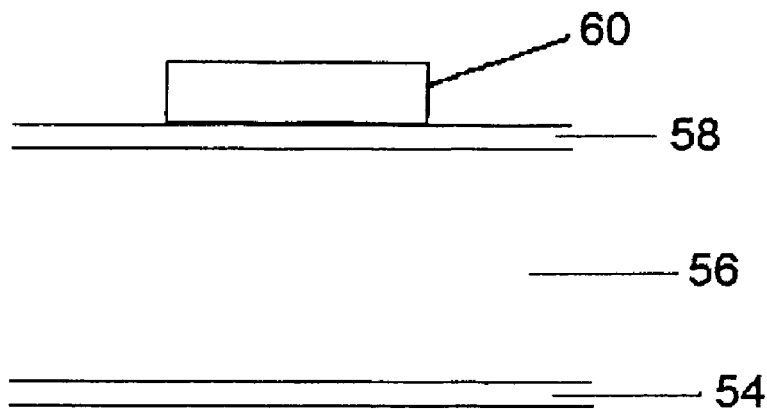
Figure 6:
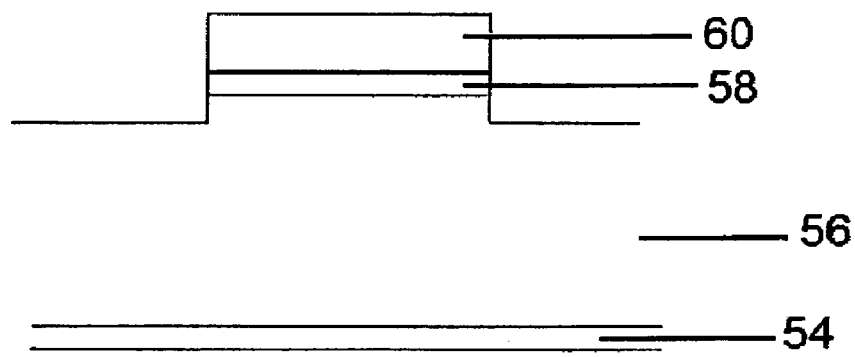
Figure 7:
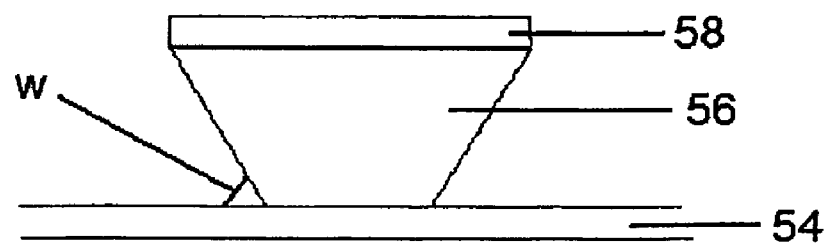

FIGS. 5 to 7 illustrate the procedure for creating the curvature of the waveguide and the slope of the lateral sides. In these figures only the layers necessary to understand the procedure are shown. For example, the metallic contact layers do not appear. The component includes successively a layer 54, a lateral optical containment layer 56 and a contact layer 58. Layer 54 is preferably made of a quaternary material such as GaInAsP, whereas the contact layer 58 is preferably made of tertiary material such as GaInAs. The lateral optical confinement layer 56 is preferably formed by p-type doped InP. It is noted that layers 54 and 58 contain arsenic, an element that blocks chemical etching by hydriodic acid, whereas layer 56 does not contain any arsenic. A resin mask 60 is deposited by photolithography on contact layer 58, covering the trace of the waveguide. This resin mask thus takes the shape desired for the waveguide, seen from above. This shape includes at least one portion that forms an angle with the normal on the output facet, as represented, for example, in FIG. 2 or 3.

The next ste in the procedure (FIG. 6) consists in ionic cleaning of the contact layer 58. The portions of this layer not located under the resin mask, thus not protected, are removed. If a metallic contact layer, platinum for example, were placed between the resin mask and the contact layer, the unprotected portions of this metallic layer would also be removed.

The component is then soaked in a hydriodic acid solution in order to form the inward slope of the lateral sides of the waveguide (FIG. 7). Preferably, the solution is pure hydriodic acid. This acid only etches the InP layer 56, the presence of arsenic in layers 54 and 58 blocking the chemical etching. This treatment with pure hydriodic acid takes about one minute, several minutes at most. The slope angle w of the inward sides is determined by the orientation of the crystal plane of the InP monocrystal material. This angle is approximately 54 degrees when the crystal plane is parallel to the yOz plane. In the curved portion of the waveguide, the crystalline plane revealed by the hydriodic acid etching is no longer the same; it follows that the slope angle w increases with the angle of curvature. The sides are thus more inward-sloping in the curved portion or portions of the guide.

The invention thus allows creation of an optoelectronic component that includes both inward sloping sides and at least one curved portion with an angle greater than two degrees. This component may be an electro-optical modulator, a semiconductor optical amplifier, a semiconductor laser or a Mach-Zehnder-type interferometer. It may also be constituted by joining two of these devices, for example a semiconductor laser followed by an electro-optical modulator.

The examples of implementations described demonstrate a component that has a straight waveguide portion followed by a curved portion. The shape of the guide may be more complex. For example, in the case of a semiconductor optical amplifier, the two ends of the guide are advantageously curved so as to prevent reflections on the two faces. The guide includes thus a curved portion, a straight portion and a curved portion or a straight guide with a strong slope in relation to the output faces (typically 7° to 10°).

While the foregoing is directed to embodiments of the present invention, other and further embodiments of the invention may be devised without departing from the basic scope thereof, and the scope thereof is determined by the claims that follow.

The invention claimed is:

1. A solid-state optoelectronic component with a waveguide in the form of a tape supported by a substrate which constitutes a layer of vertical optical confinement, the tape comprising:
    a light emerging end,
    side flanks sloping inwards on said substrate,
    a section curved by more than two degrees in relation to the perpendicular to the light emerging end, wherein side flanks in said curve section have a larger slope angle than side flanks in a straight section of said tape,
    a layer of optical confinement positioned above said substrate, and
    a contact layer positioned above said layer of optical confinement, wherein side flanks in said curve section have a larger slope angle than side flanks in a straight section of said tape.

2. The optoelectronic component of claim 1, wherein said curved section ends, at the emerging end of the waveguide, in a flared shape.

3. The opto electronic component of claim 1, wherein said curved section is flare-shaped.

4. The optoelectronic component of claim 1, wherein it constitutes a Mach-Zehnder type interferometer.

5. The optoelectronic component of claim 1, wherein it is composed of the association of several elements selected from among an electro optical modulator, a solid-state optical amplifier, a semiconductor diode and a Mach-Zehnder type interferometer.

6. The optoelectronic component of claim 1, wherein said vertical layer of optical confinement is a quaternary semiconductor and said contact layer is a ternary semiconductor.

7. The optoelectronic component of claim 1, wherein it constitutes an electro optical modulator.

8. The optoelectronic component of claim 1, wherein it constitutes a solid-state optical amplifier.

9. The optoelectronic component of claim 1, wherein it constitutes a semiconductor diode.

10. A method for making a tape for an optoelectronic component, the method comprising:
    placing a mask on a component, the component comprising a substrate, an optical containment layer, a contact layer, wherein the substrate and the contact layer comprises arsenic and the mask defines at least one straight portion and at least one curved portion;
    removing a portion of the contact layer not protected by the mask by a ionic cleaning such that the component includes at least one straight portion and at least one curved portion, wherein the at least one curved portion is curved by more than two degrees in relation to the perpendicular to a light emerging end of the component; and
    soaking the component in a hydriodic acid to form inwardly sloping side flanks on the optical containment layer, wherein side flanks in said curved portion has a larger slope angle than side flanks in the straight portion.

11. A method for making tape for a solid-state optoelectronic component with a waveguide in the form of a tape supported by a substrate comprising arsenic, the tape comprising a light emerging end, side flanks sloping inwards on said substrate, a section curved in relation to the perpendicular to the light emerging end, wherein hydrogen iodide is used to make said sloping side flanks, wherein side flanks in said curve section have a larger slope angle than side flanks in a straight section of said tape.

12. The method of claim 11, wherein said substrate is an active layer.

13. The method of claim 12 for making said tape supported by said substrate, said tape forming a stacking of layers comprising at least, starting from said substrate, a side layer of optical confinement bearing no arsenic and a contact layer bearing arsenic, wherein:
    a resin mask is photo-lithographically deposited on said contact layer, said resin mask materializing the path of said tape;
    the part of said contact layer not positioned under said layer of resin is removed via ionic removal;
    said side layer of optical confinement is chemically etched with a hydrogen iodide solution; and
    said resin mask is removed.

14. The method of claim 13, wherein said hydrogen iodide solution is pure hydrogen iodide.

15. The method of claim 13, wherein said side layer of optical confinement is made of JnP.

16. The method of claim 11, wherein said curved section slopes more than two degrees in relation to the perpendicular to the light emerging end.

* * * * *